(12) United States Patent
de Beijer et al.

(10) Patent No.: US 11,975,387 B2
(45) Date of Patent: May 7, 2024

(54) PRESS SINTERING PROCESS PRODUCT CARRIER, PRESS SINTERING APPARATUS AND PRESS SINTERING PROCESS

(71) Applicant: Boschman Technologies BV, Duiven (NL)

(72) Inventors: Johannes Cornelis de Beijer, Duiven (NL); Frank Boschman, Duiven (NL)

(73) Assignee: BOSCHMAN TECHNOLOGIES BV, Duiven (NL)

( * ) Notice: Subject to any disclaimer, the term of this patent is extended or adjusted under 35 U.S.C. 154(b) by 703 days.

(21) Appl. No.: 16/972,014

(22) PCT Filed: Jun. 14, 2019

(86) PCT No.: PCT/NL2019/050368
§ 371 (c)(1),
(2) Date: Dec. 4, 2020

(87) PCT Pub. No.: WO2019/240584
PCT Pub. Date: Dec. 19, 2019

(65) Prior Publication Data
US 2021/0354198 A1   Nov. 18, 2021

(30) Foreign Application Priority Data

Jun. 15, 2018   (NL) ...................... 2021137

(51) Int. Cl.
*H01L 21/00* (2006.01)
*B22F 3/10* (2006.01)
*H01L 21/683* (2006.01)

(52) U.S. Cl.
CPC .......... *B22F 3/1007* (2013.01); *H01L 21/683* (2013.01); *B22F 2201/20* (2013.01)

(58) Field of Classification Search
CPC ............ H01L 2224/8384; B23K 20/02; B23K 20/023; B22F 3/10; B22F 3/03; H05K 2203/1131
See application file for complete search history.

(56) References Cited

U.S. PATENT DOCUMENTS 4,885,264 A * 12/1989 Sindlhauser ....... B22D 11/0475
501/87
5,167,889 A * 12/1992 Alvarez .................. B29C 70/58
264/320

(Continued)

FOREIGN PATENT DOCUMENTS

CN   106796898 A   5/2017
CN   106876267 A   6/2017

(Continued)

*Primary Examiner* — Erin B Saad
(74) *Attorney, Agent, or Firm* — NIXON & VANDERHYE

(57) ABSTRACT

A press sintering process product carrier for carrying at least one product to be sintered in a press sintering process comprises a top side; a product receiving recess defined in the top side, and configured for receiving the product(s) therein and for carrying the product(s) on a recess bottom of the product receiving recess; a top side surface surrounding the product receiving recess; a holding groove provided in the top side surface and surrounding the product receiving recess, and a vacuum connection in fluid connection with the holding groove to allow providing a vacuum in the holding groove for holding a film, foil or sheet of material provided over the product receiving recess and the holding groove; and a recess gas inlet arranged in the product receiving recess for introducing a gas into the product receiving recess, and a recess gas outlet arranged in the product receiving recess for extracting gas from the product receiv- (Continued)

ing recess to allow providing a flow of gas from the recess gas inlet to the recess gas outlet for purging the product receiving recess.

18 Claims, 5 Drawing Sheets

(56) References Cited

U.S. PATENT DOCUMENTS

| | | | | |
|---|---|---|---|---|
| 5,536,485 | A * | 7/1996 | Kume | C23C 14/223 419/13 |
| 5,863,398 | A * | 1/1999 | Kardokus | H01J 37/3435 228/208 |
| 5,893,511 | A * | 4/1999 | Schwarzbauer | H01L 24/75 228/208 |
| 6,019,937 | A * | 2/2000 | Shivanath | C22C 33/02 419/36 |
| 6,079,276 | A * | 6/2000 | Frick | G01L 9/0075 361/283.4 |
| 6,122,170 | A * | 9/2000 | Hirose | C04B 37/026 174/16.3 |
| 6,189,210 | B1 * | 2/2001 | Cox | H01R 43/0263 29/729 |
| 6,237,832 | B1 * | 5/2001 | Chung | B23K 3/087 228/43 |
| 8,283,756 | B2 * | 10/2012 | Galesic | H01L 24/29 257/748 |
| 8,434,658 | B2 * | 5/2013 | Ishikawa | H05K 3/341 228/103 |
| 9,048,245 | B2 * | 6/2015 | Blackshear | H01L 23/562 |
| 2002/0093080 | A1 * | 7/2002 | Kay | H01L 21/67333 257/678 |
| 2004/0011283 | A1 * | 1/2004 | Gochnour | H05K 3/284 118/500 |
| 2007/0148496 | A1 * | 6/2007 | Takaoka | C23C 14/0641 428/701 |
| 2007/0275268 | A1 * | 11/2007 | Takaoka | C23C 14/022 428/698 |
| 2009/0023250 | A1 | 1/2009 | Speckels et al. | |
| 2009/0165957 | A1 * | 7/2009 | Lee | B32B 37/0046 156/379 |
| 2011/0049221 | A1 * | 3/2011 | Blais | H01L 24/81 228/101 |
| 2013/0040424 | A1 * | 2/2013 | Bayerer | H01L 24/83 156/583.1 |
| 2013/0189389 | A1 * | 7/2013 | Kim | B28B 3/08 425/412 |
| 2015/0371880 | A1 * | 12/2015 | De Beijer | H01L 21/67092 425/129.1 |
| 2017/0229424 | A1 * | 8/2017 | Eisele | H01L 24/32 |
| 2018/0237309 | A1 * | 8/2018 | Park | C01F 17/218 |
| 2021/0121962 | A1 * | 4/2021 | Birkicht | H01L 24/83 |
| 2021/0170708 | A1 * | 6/2021 | Schivalocchi | H01L 21/50 |
| 2021/0354198 | A1 * | 11/2021 | de Beijer | B22F 3/1007 |
| 2023/0023512 | A1 * | 1/2023 | Birkicht | H01L 21/60 |

FOREIGN PATENT DOCUMENTS

| | | |
|---|---|---|
| DE | 10 2008 033 651 A1 | 1/2009 |
| DE | 10 2014114 097 A1 | 3/2016 |
| EP | 3253177 A1 | 12/2017 |
| JP | 2001303105 A | 10/2001 |
| JP | 2011222555 A | 11/2011 |
| WO | 2005/042160 A2 | 5/2005 |
| WO | 2013/167289 A1 | 11/2013 |

* cited by examiner

PRESS SINTERING PROCESS PRODUCT CARRIER, PRESS SINTERING APPARATUS AND PRESS SINTERING PROCESS

FIELD OF THE INVENTION

The invention relates to a press sintering process product carrier for carrying one or more products to be sintered in a press sintering process, the product carrier comprising a top side for carrying the product(s) thereon. The invention further relates to a press sintering apparatus comprising the product carrier, and a press sintering process.

BACKGROUND OF THE INVENTION

Semiconductor dies may be bonded to a substrate in a press sintering process, although a press sintering process is not restricted to only semiconductor dies and underlying substrates, for instance, to achieve a high heat conductivity from the semiconductor product to the substrate. Sintering of bonds from high conductive metals like silver or copper is done at elevated temperatures, typically in the range of 250° C. 300° C., while a pressure is applied onto the product that is sinter bonded to its underlying substrate. Parts of the product(s) to be sintered which have not been coated with a protective coating will oxidize rapidly at these elevated temperatures. Copper, for instance, will oxidize in complex oxides which are difficult to remove at a later moment in the process. These oxides causes quality problems at subsequent processes like wire bonding.

Another issue is that contaminants are released from the sintering materials, like in sintering pastes and films, at the elevated temperatures during the sintering process, which generally gives rise to contamination of the products as well.

A commonly used method is to create a protective atmosphere with an inert gas like nitrogen. This is done in an enclosed process chamber, or in multiple process chambers which are interconnected with airtight gates between them. A sintering process commonly has three phases: a preheating stage of the product to be sintered, the actual sintering stage, and cooling the product down to room temperature again. These phases can be done in one process chamber or in separated chambers. In both cases the atmosphere must be changed each cycle, which is done by evacuating the chamber and introducing the inert gas into the chamber. Each chamber requires an atmosphere change, in case the three phases are done in three separate chambers, thus requiring a three-time atmosphere change.

The atmosphere change takes quite a long time since the volume of the process chambers is rather large. Therefore, the cycle times of the known sintering systems and processes are must longer than required for the actual sintering processes itself.

SUMMARY OF THE INVENTION

It is an objective of the invention to allow for a press sintering process and apparatus with a reduced cycle time.

It is another or alternative objective of the invention to allow for a press sintering process and apparatus that provides for a reduced contamination level.

It is yet another or alternative objective of the invention to allow for a press sintering process and apparatus which do not present undesired chemical reactions, especially oxidation, during the sintering process.

It is yet another or alternative objective of the invention to allow using a reduced amount of inert gas in the press sintering process and apparatus.

At least one of the above objectives is achieved by a press sintering process product carrier for carrying at least one product to be sintered in a press sintering process, the product carrier comprising a top side;
a product receiving recess defined in the top side, and configured for receiving the product(s) therein and for carrying the product(s) on a recess bottom of the product receiving recess;
a top side surface surrounding the product receiving recess;
a holding groove provided in the top side surface and surrounding the product receiving recess, and a vacuum connection in fluid connection with the holding groove to allow providing a vacuum in the holding groove for holding a flexible cover, such as a film, foil or sheet of material, provided over the product receiving recess and the holding groove; and
a recess gas inlet arranged in the product receiving recess for introducing a gas into the product receiving recess, and a recess gas outlet arranged in the product receiving recess for extracting gas from the product receiving recess to allow providing a gas flow from the recess gas inlet to the recess gas outlet for purging the product receiving recess.

In stead of moving the products to be sintered from chamber to chamber and changing atmosphere each phase, the products are placed in a moveable product carrier in which a protective atmosphere is created only once at the start of the first phase. This protective atmosphere can be maintained each phase until the product is cooled down to room temperature. The product carrier passes through all three phases of the sintering process and can then be passed back to the start of the first phase.

The protective atmosphere in the small product receiving recess is created by closing the recess by a film, foil or sheet of material after product placement to provide a recess chamber, and flushing the small recess chamber with an inert gas like nitrogen. The volume of the recess chamber need only to be somewhat larger than the volume of the product to be sintered. The recess chamber is closed with a film, foil or sheet of, for instance, Teflon, which is held by a vacuum to ensure good closure of the recess chamber. At one side inside the chamber the inert gas is inserted thru multiple holes and pushes the entrapped air in the chamber thru exhaust holes at opposite side. These exhaust holes are located at lower level than flush holes to ensure all air is pushed out of the small chamber, air is heavier than nitrogen.

In an embodiment the top side surface is planar.

In an embodiment the top side surface fully surrounds the product receiving recess.

In an embodiment the holding groove fully surrounds the product receiving recess.

In an embodiment the recess gas inlet is provided at a first side of the product receiving recess and the recess gas outlet is provided at a second side of the product receiving recess, the second side opposing the first side.

In an embodiment the recess gas inlet comprises a plurality of gas inlet openings distributed along a side of the product receiving recess, the gas inlet openings being arranged for providing, in use, an outflow of gas from the gas inlet openings in a direction of the product(s) carried on the recess bottom.

In an embodiment the plurality of gas inlet openings is configured to provide, in use, a laminar flow of gas.

In an embodiment the recess gas outlet comprises a plurality of gas outlet openings distributed along a side of the product receiving recess.

In an embodiment the recess gas outlet is provided at a lower level with respect to an, in use, horizontal plane than the recess gas inlet.

In an embodiment an additional recess is provided in the recess bottom at a side of the product receiving recess where the recess gas outlet is provided.

In an embodiment the vacuum connection is provided at a position on the product carrier such that the holding groove is in between the product receiving recess and the vacuum connection as seen along external surfaces of the product carrier, optionally the vacuum connection being provided on a side surface of the product carrier.

In an embodiment the product carrier comprises a first gas connection for connection to a gas source, the first gas connection being in fluid connection with the recess gas inlet and being provided at a position on the product carrier such that the holding groove is in between the product receiving recess and the first gas connection as seen along external surfaces of the product carrier, optionally the first gas connection being provided on a side surface of the product carrier.

In an embodiment the product carrier comprises a second gas connection for connection to a gas drain, such as a pump, the second gas connection being in fluid connection with the recess gas outlet and being provided at a position on the product carrier such that the holding groove is in between the product receiving recess and the second gas connection as seen along external surfaces of the product carrier, optionally the second gas connection being provided on a side surface of the product carrier.

In an embodiment the product carrier further comprises at least one of an arrangement for cooling the product carrier and the product(s) carried thereby, and an arrangement for heating the product carrier and the product(s) carried thereby.

In an embodiment the product carrier further comprises a flexible cover, such as a film, foil or sheet of material, for covering the product receiving recess and the holding groove.

In another aspect the invention provides for a kit of a product carrier as referred to above and a flexible cover, such as a film, foil or sheet of material, configured for covering the product receiving recess and the holding groove.

In another aspect the invention provides for a sintering apparatus comprising a product carrier as referred to above.

In another aspect the invention provides for a press sintering process comprising the steps of
providing a press sintering process product carrier comprising
   a top side;
   a product receiving recess defined in the top side, and configured for receiving the product(s) therein and for carrying the product(s) on a recess bottom of the product receiving recess;
   a top side surface surrounding the product receiving recess;
   a holding groove provided in the top side surface and surrounding the product receiving recess, and a vacuum connection in fluid connection with the holding groove to allow providing a vacuum in the holding groove for holding a flexible cover, such as a film, foil or sheet of material, provided over the product receiving recess and the holding groove; and
   a recess gas inlet arranged in the product receiving recess for introducing a gas into the product receiving recess, and a recess gas outlet arranged in the product receiving recess for extracting gas from the product receiving recess to allow providing a gas flow from the recess gas inlet to the recess gas outlet for purging the product receiving recess;
providing at least one product to be sintered;
providing the product(s) into the product receiving recess of the product carrier to cover the product receiving recess;
providing a flexible cover, such as a film, foil or sheet of material, over the product receiving recess and the holding groove;
applying a vacuum to the vacuum connection to provide a vacuum in the holding groove for holding the cover onto the top side surface over the product receiving recess;
introducing a gas, optionally nitrogen, through the recess gas inlet into the product receiving recess, and extracting gas through the recess gas outlet from the product receiving recess to provide a gas flow from the recess gas inlet to the recess gas outlet for purging the product receiving recess; and
sintering the product(s) while being carried by the product carrier in the product receiving recess and covered by the flexible cover, and while applying a pressure onto the flexible cover and the product.

In another aspect the invention provides for a film, foil or sheet of material configured for covering the product receiving recess of a press sintering process product carrier as referred to above and/or use in the press sintering process as referred to above.

In another aspect the invention provides for making a film, foil or sheet of material as referred to above.

BRIEF DESCRIPTION OF THE DRAWINGS

Further features and advantages of the invention will become apparent from the description of the invention by way of non-limiting and non-exclusive embodiments. These embodiments are not to be construed as limiting the scope of protection. The person skilled in the art will realize that other alternatives and equivalent embodiments of the invention can be conceived and reduced to practice without departing from the scope of the present invention. Embodiments of the invention will be described with reference to the accompanying drawings, in which like or same reference symbols denote like, same or corresponding parts, and in which.

DETAILED DESCRIPTION OF EMBODIMENTS

Figure 1:
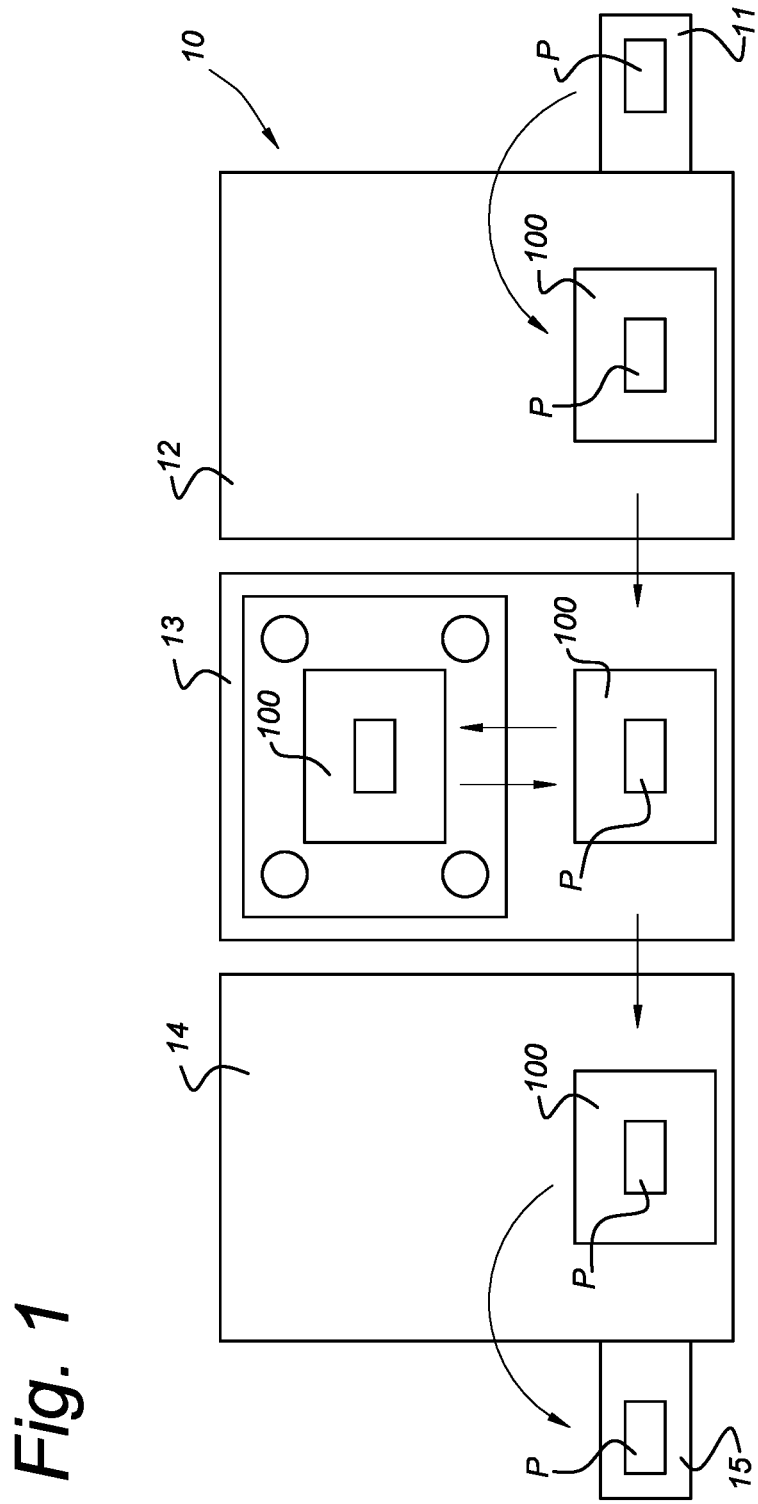
FIG. 1 shows a schematic overview of a sintering process and apparatus.
Figure 2:
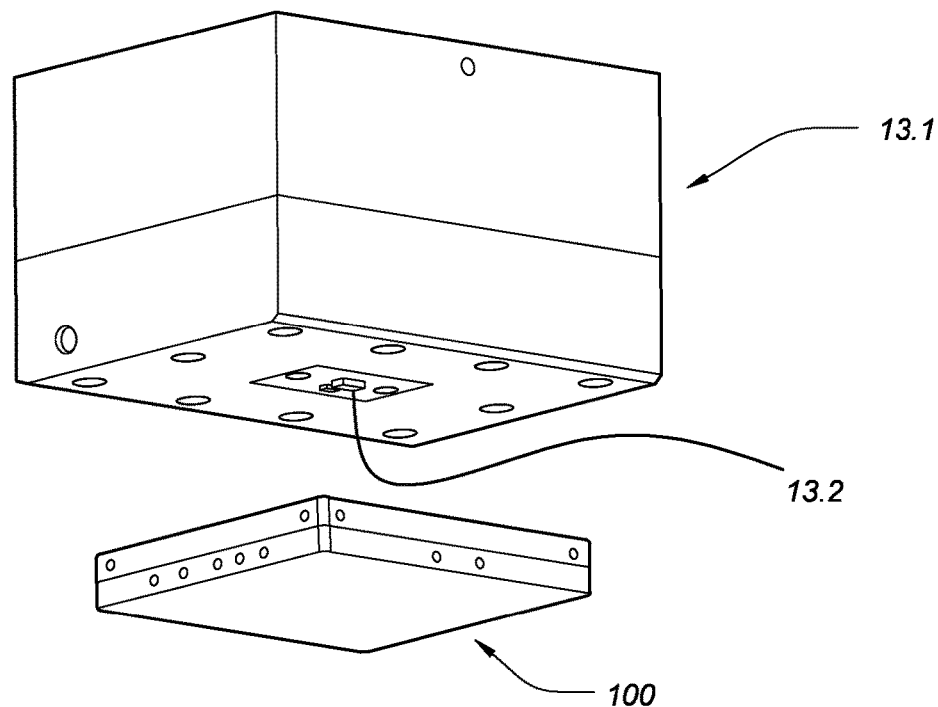
FIG. 2 shows a schematic view of a sintering process product carrier below a part of a sintering apparatus.

The sintering apparatus 10, and corresponding sintering process, schematically shown in FIG. 1 provides an input conveyer 11 for receiving one or more products P to be sintered. The products are then transferred to a press sintering process product carrier 100 according to the invention in the press sintering apparatus 10 for further processing in the sintering apparatus. Alternatively, the one or more products P can be provided onto the press sintering process product carrier 100 (further referred to as product carrier) first and subsequently be transferred to the input conveyer 11, after which the product carrier 100 according to the invention, together with the one or more products carried thereon, is transferred into the sintering apparatus 10 for further processing therein. In a first stage 12 the product carrier 100 with product(s) P is preheated and subsequently transferred to a press sintering stage 13 for further heating and applying pressure onto the product(s) P. FIG. 2 shows the product carrier 100 below a pressure block 13.1 of the press sintering stage 13. The pressure block is to exert a pressure onto the products P to be sintered. The pressure block shown has a product dependable movable insert 13.2 that can be lowered from the pressure block 13.1 to exert pressure onto the product(s) P. The block may also have fixed protruding inserts. More than one insert 13.2 can be present. The number of inserts 13.2 may correspond to the number of products P carried on the product carrier 100. In yet other embodiments of the pressure block, a larger pressure block with a flat bottom side can be provided to exert pressure onto one or more products, optionally with a resilient and or compliant material, like a silicone mat, between pressure block and product(s). Various embodiments are available in that regard. After press sintering in the sintering stage 13, the product carrier 100 with product(s) P is transferred to a cool down stage 14 for cooling down the product carrier and products thereon. Subsequently, the individual products P are transferred to an output conveyer 15, or the product carrier 100 with product(s) thereon is transferred to the output conveyer 15 for further handling.

Figure 3:
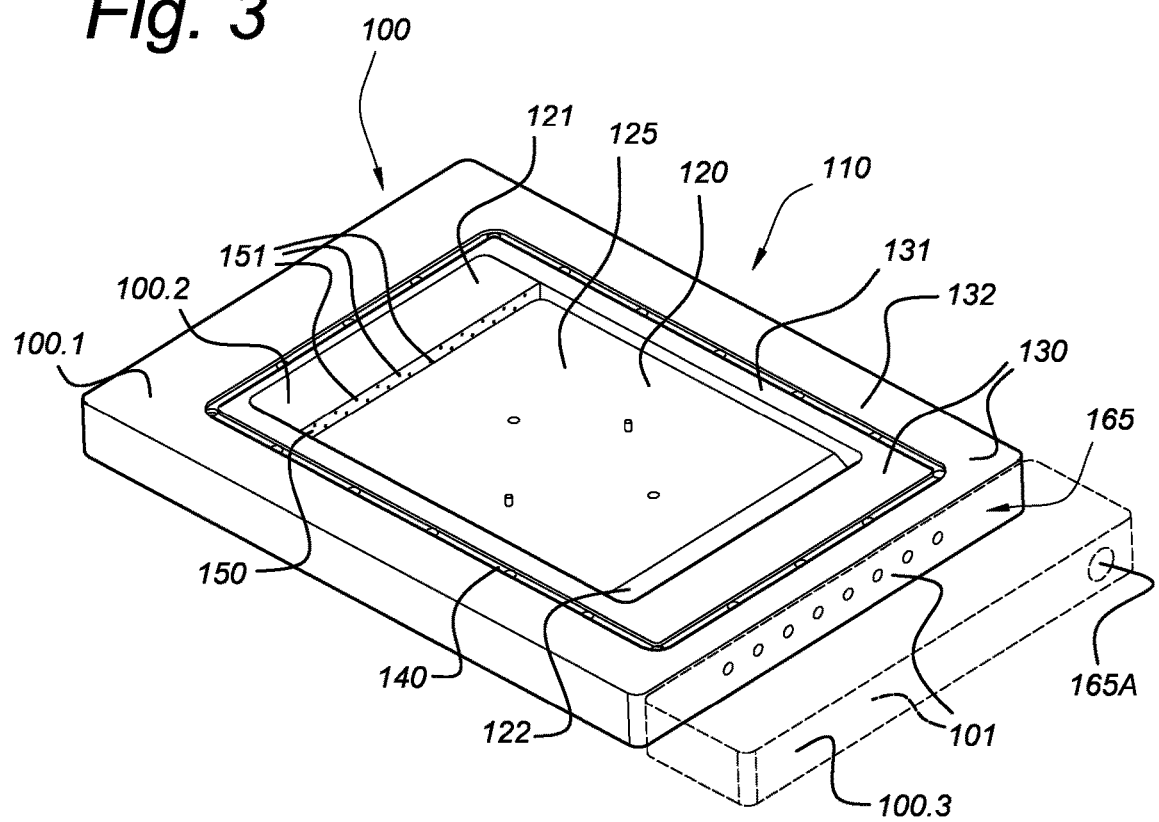
FIG. 3 an embodiment of a sintering process product carrier.
Figure 4A:
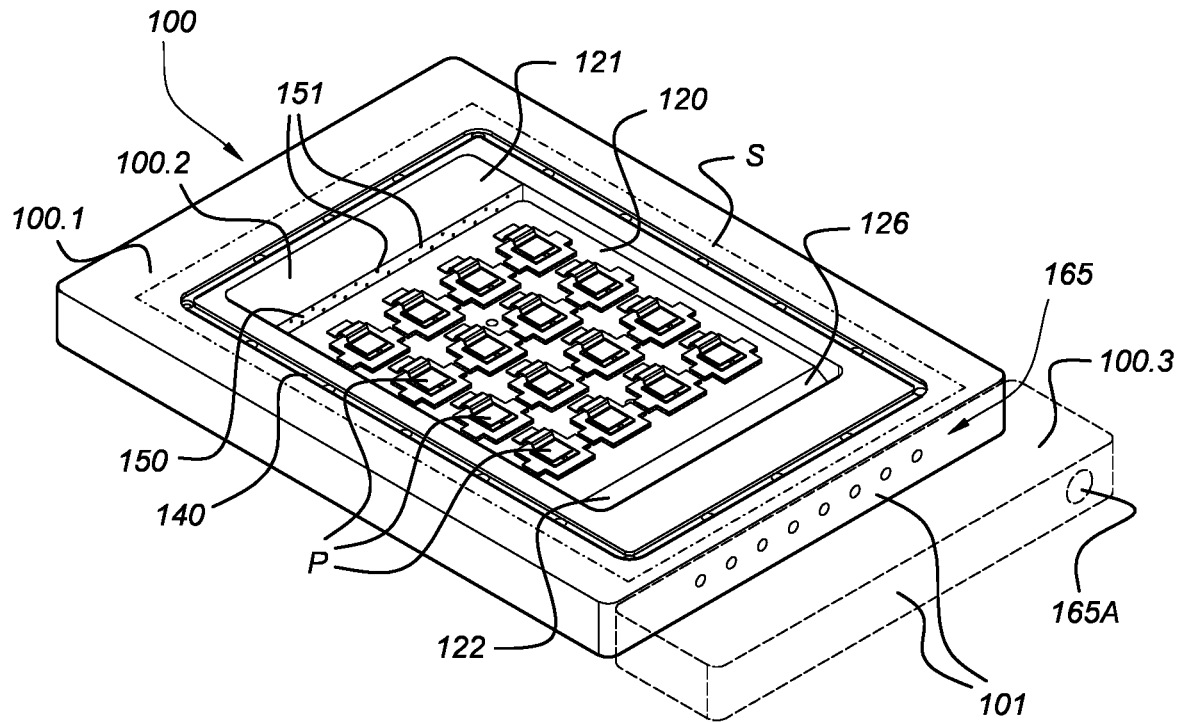
FIGS. 4A and 4B show perspective views of the product carrier of FIG. 3 with products carried thereon.
Figure 4B:
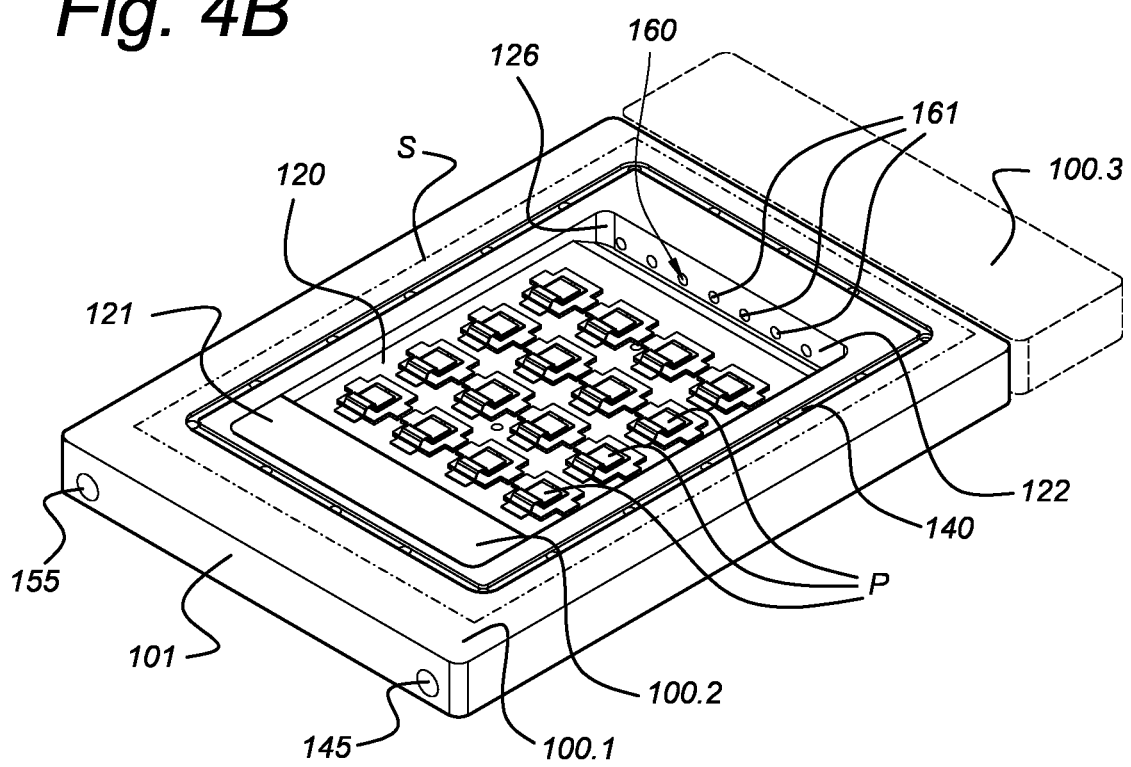

FIG. 3 shows a perspective view of the product carrier 100 in more detail. FIGS. 4A and 4B show different perspective views of the product carrier with multiple products P carried thereon. The product carrier comprises a top side 110 for carrying the one or more products P thereon. The products are carried such on the product carrier that they can be accessed in the sintering process by the (movable) insert(s) 13.2. A product receiving recess 120 is defined in the top side 110 of the product carrier. The product receiving recess 120 is configured for receiving the one or more products therein and for carrying the product(s) on a recess bottom 125 of the product receiving recess. A planar top surface 130 surrounds the product receiving recess 120. A holding groove 140 is provided in the top surface 130 and surrounds the product receiving recess 120. Both the top side surface 130 and the holding groove 140 fully surround the product receiving recess 120 in the embodiment shown. A top side surface part 131 of the top side surface 130 is located in between the product receiving recess 120 and the holding groove 140, and another top side surface part 132 is located at the outside perimeter side of the holding groove 140.

Figure 5:
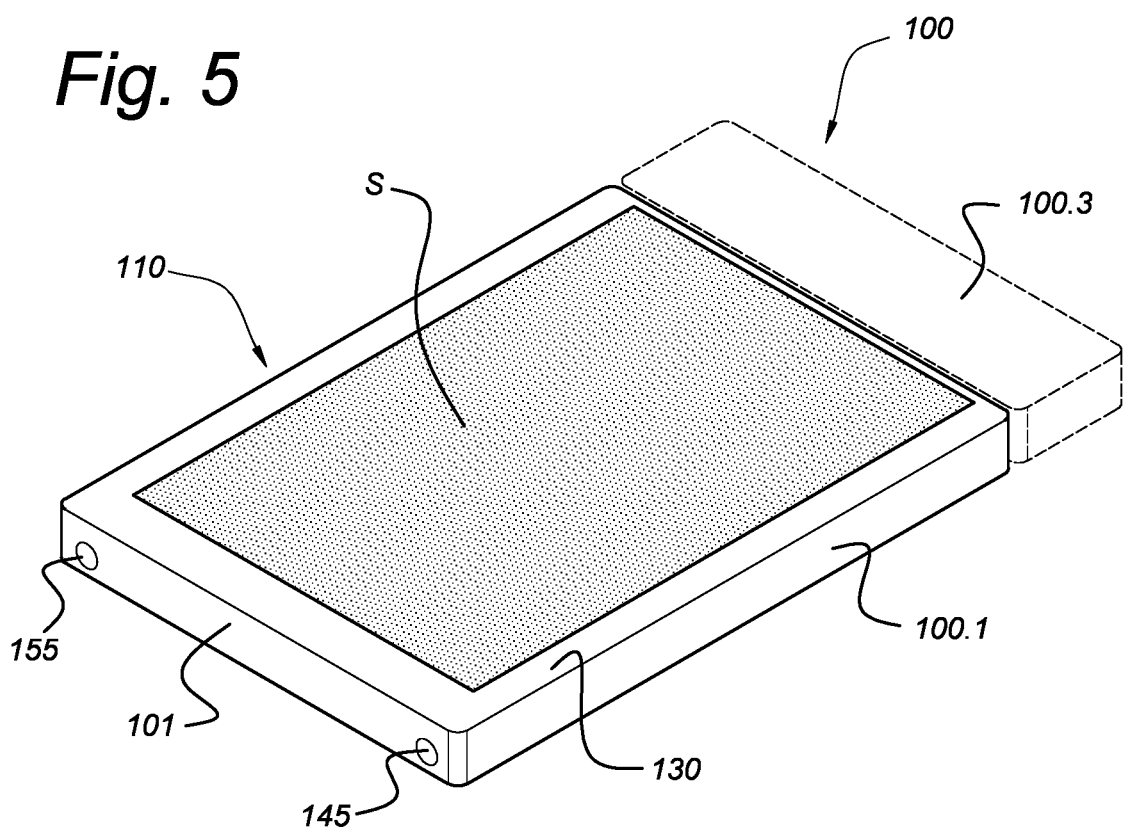
FIG. 5 shows the product carrier of FIG. 4A with a Teflon sheet over the product receiving recess.
Figure 6A:
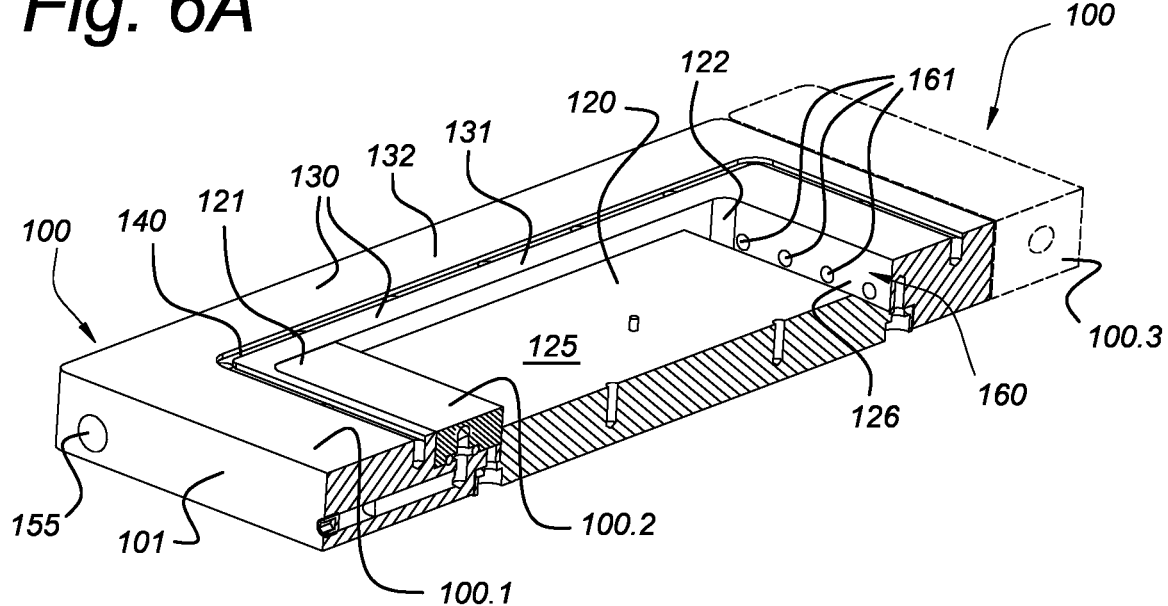
FIGS. 6A and 6B show perspective views of cross-sections of the product carrier of FIG. 3.
Figure 6B:
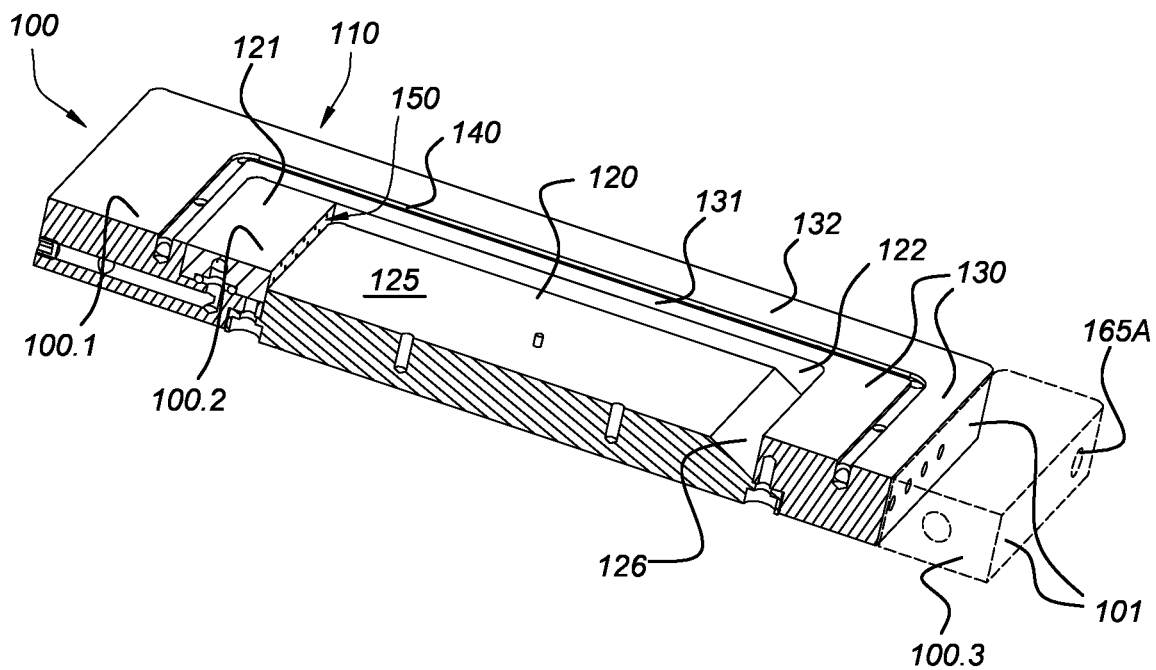

A vacuum connection 145 is provided on the product carrier in fluid connection with the holding groove 140 to allow providing a vacuum in the holding groove for holding a flexible cover, such as a film, foil or sheet of material, provided over the product receiving recess 120 and the groove 140. FIGS. 4A and 4B show the outline of the cover in the form of a sheet S of Teflon in the embodiment shown, which can be provided over the product receiving recess 120 and holding groove 140. FIG. 5 shows the sheet S of Teflon in place. A vacuum provided in the holding groove 140 acts to hold the sheet S onto the top side surface 130 and over the product receiving recess 120. A pump (not shown) can be connected to the vacuum connection 145 for generating the vacuum. Ducts are manufactured in the product carrier to provide for the fluid connection between the holding groove 140 and the vacuum connection 145. The vacuum connection 145 is provided at a position on the product carrier 100 such that the holding groove 140 is in between the product receiving recess 120 and the vacuum connection as seen along external surfaces of the product carrier. The vacuum connection 145 is provided on a side surface 101 at the front of the product carrier 100 in the embodiment shown.

The product carrier 100 further has a recess gas inlet 150 arranged in the product receiving recess 120 for introducing a gas into the product receiving recess, and a recess gas outlet 160 arranged in the product receiving recess for extracting gas from the product receiving recess. The recess gas inlet 150 is provided at a first side 121 of the product receiving recess 120 and the recess gas outlet 160 is provided at a second side 122 of the product receiving recess. The second side 122 opposes the first side 121 of the product receiving recess 120. In use, a flow of gas will therefore be provided from the recess gas inlet 150, passing the products P to the recess gas outlet 160 to purge the product receiving recess. Any contamination generated during the sintering process will thus be carried away from the products with the flow of gas.

The recess gas inlet 150 comprises a plurality of gas inlet openings 151 distributed along the first side 121 of the product receiving recess 120. The gas inlet openings are distributed over the full first side 121. The gas inlet openings 151 are provided such as to provide, in use, an outflow of gas from the gas inlet openings in a direction of the products P carried on the recess bottom 125 in the product receiving recess 120, and are configured to provide a laminar flow of gas. On the opposing second side 122 of the product receiving recess 120, the recess gas outlet 160 comprises a plurality of gas outlet openings 161 distributed along the second side. The gas outlet openings 161 are distributed over the full second side 121.

The recess bottom 125 is largely planar to be provided, in use, along a horizontal plane in the sintering process. The products P are generally provided at some distance above the recess bottom on protrusions extending from the recess bottom 125. A top side of the products P carried in the product receiving recess 120 is generally below the top side surface 130, so there will some distance between the products and the flexible cover in the form of the sheet S of, for instance, Teflon, provided over the product receiving recess 120. The flow of gas will pass over, under and alongside the products P from the recess gas inlet 150 to the recess gas outlet 160 to entrain any contamination from the products. The recess gas outlet 160 is provided at a lower level with respect to the horizontal plane than the recess gas inlet 150. Oxygen is heavier than a generally used purging gas, such as nitrogen, to provide for a gas flow from the recess gas inlet 150 to the recess gas outlet 160. The recess gas outlet 160 being at a lower level than the recess gas inlet 150 ensures that the heavier oxygen accumulates at the lower level and is efficiently removed from the product receiving recess 120. An additional recess 126 is provided in the recess bottom 125 at the second side 122 of the product receiving recess 120, to allow the recess gas outlet 160 to be provided at the lower level.

The product carrier 100 comprises a first gas connection 155 for connection to a gas source of purging gas. The first gas connection 155 is in fluid connection with the recess gas inlet 150 by ducts provided in the product carrier 100. The first gas connection 155 is provided at a position on the product carrier such that the holding groove 140 is in between the product receiving recess 120 and the first gas connection as seen along external surfaces of the product carrier. In the embodiment shown, the first gas connection 155 is provided on a side surface 101 at the front of the product carrier. The figures show that first and second product carrier parts 100.1, 100.2 are present to allow manufacturing the fluid connection providing ducts from the first gas connection 155 to the recess gas inlet 150.

The product carrier 100 comprises a second gas connection 165, 165A for connection to a gas drain. The second gas connection 165, 165A is in fluid connection with the recess gas outlet 160 through ducts provided in the product carrier. The second gas connection 165, 165A is provided at a position on the product carrier such that the holding groove 140 is in between the product receiving recess 120 and the second gas connection as seen along external surfaces of the product carrier. The figures show two types of second gas connection 165, 165A. In a first variant of the second gas connection 165 the purging gas is allowed to flow out from the second gas connection 165 into the ambient surroundings at ambient pressure. A purging gas flow will be present inside the product receiving recess 120 when the pressure of the gas at the first gas connection 155 is higher than ambient pressure. The ambient surroundings act as a gas drain. In a second variant of the second gas connection 165A, a third product carrier part 100.3 is provided with internal ducts to provide for fluid connection of the second gas connection 165A with the recess gas outlet 160. The second variant of the second gas connection 165A allows for connection to a pump to pump away the purging gas. The third product carrier part 100.3 is shown in dashed lines as an optional part in the drawings.

As described above with reference to FIGS. 1 and 2, one or more products P to be sintered are to be provided in the product receiving recess 120 of the sintering process product carrier 100 in the overall sintering process. A flexible cover, such as a film, foil or sheet S of material, for instance a sheet S of Teflon, is provided over the product receiving recess 120 and holding groove 140, and a vacuum is applied to the holding groove to hold the sheet S on the top side surface of the product carrier. A purging gas source, such as a source of nitrogen is connected to the first gas connection 145 to allow for a flow of purge gas in the product receiving space 120. A pump may be connected to second gas connection 165A or the purge gas may be allowed to flow out of second gas connection 165 into the ambient surroundings. Subsequently, the product(s) carried in the product carrier are processed in the processing stages as has been described with reference to FIGS. 1 and 2 above. The flexible cover provided over the product receiving recess 120 still allows applying a pressure onto the products P by the (movable) inserts 13.2. The inserts apply a pressure onto the product(s) while the flexible cover is in between insert and product.

In an embodiment the product carrier 100 comprises an arrangement an arrangement for cooling the product carrier and product(s) carried thereby and/or an arrangement for heating the product carrier and product(s) carried thereby. The heating arrangement can, for instance, be an electrical heater incorporated in the product carrier. The cooling arrangements can, for instance, be cooling channels provided in the product carrier for circulating a cooling medium there through.

The invention claimed is:

1. A press sintering process product carrier for carrying at least one product to be sintered in a press sintering process, the product carrier comprising
   a top side;
   a product receiving recess defined in the top side, and configured for receiving the product(s) therein and for carrying the product(s) on a recess bottom of the product receiving recess;
   a top side surface surrounding the product receiving recess;
   a holding groove provided in the top side surface and surrounding the product receiving recess, and a vacuum connection in fluid connection with the holding groove to allow providing a vacuum in the holding groove for holding a flexible cover, such as a film, foil or sheet of material, provided over the product receiving recess and the holding groove; and
   a recess gas inlet arranged in the product receiving recess for introducing a gas into the product receiving recess, and a recess gas outlet arranged in the product receiving recess for extracting gas from the product receiving recess to allow providing a flow of gas from the recess gas inlet to the recess gas outlet for purging the product receiving recess.

2. The product carrier according to claim 1, wherein the top side surface is planar.

3. The product carrier according to claim 1, wherein the top side surface fully surrounds the product receiving recess.

4. The product carrier according to claim 1, wherein the holding groove fully surrounds the product receiving recess.

5. The product carrier according to claim 1, wherein the recess gas inlet is provided at a first side of the product receiving recess and the recess gas outlet is provided at a second side of the product receiving recess, the second side opposing the first side.

6. The product carrier according to claim 1, wherein the recess gas inlet comprises a plurality of gas inlet openings distributed along a side of the product receiving recess, the gas inlet openings being arranged for providing, in use, an outflow of gas from the gas inlet openings in a direction of the product(s) carried on the recess bottom.

7. The product carrier according to claim 6, wherein the plurality of gas inlet openings is configured to provide, in use, a laminar flow of gas.

8. The product carrier according to claim 1, wherein the recess gas outlet comprises a plurality of gas outlet openings distributed along a side of the product receiving recess.

9. The product carrier according to claim 1, wherein the recess gas outlet is provided at a lower level with respect to an, in use, horizontal plane than the recess gas inlet.

10. The product carrier according to claim 9, wherein an additional recess is provided in the recess bottom at a side of the product receiving recess where the recess gas outlet is provided.

11. The product carrier according to claim 1, wherein the vacuum connection is provided at a position on the product carrier such that the holding groove is in between the product receiving recess and the vacuum connection as seen along external surfaces of the product carrier, optionally the vacuum connection being provided on a side surface of the product carrier.

12. The product carrier according to claim 1, wherein the product carrier comprises a first gas connection for connection to a gas source, the first gas connection being in fluid connection with the recess gas inlet and being provided at a position on the product carrier such that the holding groove is in between the product receiving recess and the first gas connection as seen along external surfaces of the product carrier, optionally the first gas connection being provided on a side surface of the product carrier.

13. The product carrier according to claim 1, wherein the product carrier comprises a second gas connection for connection to a gas drain, such as a pump, the second gas connection being in fluid connection with the recess gas outlet and being provided at a position on the product carrier such that the holding groove is in between the product receiving recess and the second gas connection as seen along external surfaces of the product carrier, optionally the second gas connection being provided on a side surface-of the product carrier.

14. The product carrier according to claim 1, wherein the product carrier further comprises at least one of an arrangement for cooling the product carrier and the product(s) carried thereby, and an arrangement for heating the product carrier and the product(s) carried thereby.

15. The product carrier according to claim 1, wherein the product carrier further comprises a flexible cover, such as a film, foil or sheet of material, for covering the product receiving recess and the holding groove.

16. A kit of a product carrier according to claim 1 and a flexible cover, such as a film, foil or sheet of material, configured for covering the product receiving recess and the holding groove.

17. A sintering apparatus comprising a product carrier according to claim 1.

18. A press sintering process comprising the steps of
providing a press sintering process product carrier comprising:
a top side;
a product receiving recess defined in the top side, and configured for receiving the product(s) therein and for carrying the product(s) on a recess bottom of the product receiving recess;
a top side surface surrounding the product receiving recess;
a holding groove provided in the top side surface and surrounding the product receiving recess, and a vacuum connection in fluid connection with the holding groove to allow providing a vacuum in the holding groove for holding a flexible cover, such as a film, foil or sheet of material, provided over the product receiving recess and the holding groove; and
a recess gas inlet arranged in the product receiving recess for introducing a gas into the product receiving recess, and a recess gas outlet arranged in the product receiving recess for extracting gas from the product receiving recess to allow providing a flow of gas from the recess gas inlet to the recess gas outlet for purging the product receiving recess;
providing at least one product to be sintered;
providing the product(s) into the product receiving recess of the product carrier;
providing a flexible cover, such as a film, foil or sheet of material, over the product receiving recess and the holding groove to cover the product receiving recess;
applying a vacuum to the vacuum connection to provide a vacuum in the holding groove for holding the cover onto the top side surface over the product receiving recess;
introducing a gas, optionally nitrogen, through the recess gas inlet into the product receiving recess, and extracting gas through the recess gas outlet from the product receiving recess to provide a flow of gas from the recess gas inlet to the recess gas outlet for purging the product receiving recess; and
sintering the product(s) while being carried by the product carrier in the product receiving recess and covered by the flexible cover, and while applying a pressure onto the flexible cover and the product.

* * * * *